(12) United States Patent
Kister

(10) Patent No.: US 6,530,148 B1
(45) Date of Patent: Mar. 11, 2003

(54) METHOD FOR MAKING A PROBE APPARATUS FOR TESTING INTEGRATED CIRCUITS

(75) Inventor: January Kister, Redwood City, CA (US)

(73) Assignee: Kulicke and Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 09/579,718

(22) Filed: May 26, 2000

Related U.S. Application Data

(62) Division of application No. 09/264,599, filed on Mar. 8, 1999, now Pat. No. 6,419,500.

(51) Int. Cl.[7] .............................. H05K 3/00; H01R 12/00
(52) U.S. Cl. ............................ 29/842; 29/840; 29/843; 29/846; 29/DIG. 44; 439/66; 439/91; 324/754; 324/761; 451/6; 451/49
(58) Field of Search .................... 29/842, 843, DIG. 44, 29/840, 846, 825; 439/66, 912, 71, 91; 324/754, 761, 72.5; 451/6, 8, 49

(56) References Cited

U.S. PATENT DOCUMENTS

| | | | |
|---|---|---|---|
| 3,806,801 A | 4/1974 | Bove | 324/72.5 |
| 4,027,935 A | 6/1977 | Byrnes et al. | 339/48 |
| 4,038,599 A | 7/1977 | Bove et al. | 324/158 |
| 4,506,215 A | 3/1985 | Coughlin | 324/158 |
| 4,518,910 A | 5/1985 | Hottenrott et al. | 324/158 |
| 4,686,969 A | 8/1987 | Scott | 128/80 C |
| 4,901,013 A | 2/1990 | Benedetto et al. | 324/158 |
| 5,132,613 A | 7/1992 | Papae et al. | 324/158 F |
| 5,513,430 A * | 5/1996 | Yanof et al. | 29/846 |
| 5,806,181 A | 9/1998 | Khandros et al. | 29/847 |
| 5,821,763 A | 10/1998 | Beaman et al. | 324/754 |
| 5,878,486 A * | 3/1999 | Eldridge et al. | 29/840 |
| 5,977,787 A * | 11/1999 | Das et al. | 324/761 |
| 6,118,290 A * | 9/2000 | Sugiyama et al. | 324/754 |
| 6,419,500 B1 * | 7/2002 | Krister | 439/66 |
| 6,419,550 B2 * | 7/2002 | Hembree | 451/6 |

* cited by examiner

*Primary Examiner*—Peter Vo
*Assistant Examiner*—Minh Trinh
(74) *Attorney, Agent, or Firm*—Lumen Intellectual Property Services, Inc.

(57) ABSTRACT

The present invention provides a method for sanding heads of buckling beam probes while the probes are disposed within a probe assembly between a lower die and upper die. Sanding provides that all the probes within a probe assembly have the same total length from tip to head. The method calls for contacting the probe tips to a flat fiducial plate such as a glass plate to ensure that the probe tips are coplanar. Then, the heads are sanded to a plane which is parallel with the fiducial plate. Preferably, the heads are sanded by placing the assembly and fiducial plate onto a Z-stage capable of moving in a Z direction. The Z-stage is located under a top surface of a table having a hole directly above the Z-stage. Raising the Z-stage lifts the probe heads to extend above the top surface of the table. Then, an abrasive plate resting on the top surface of the table is rubbed on the heads. Material is removed from the heads until all the probes are the same length. Probe assemblies made according to the present invention have probe heads with characteristic sanded top surfaces and the probes have the same length, generally to within 0.0001 inches.

6 Claims, 5 Drawing Sheets

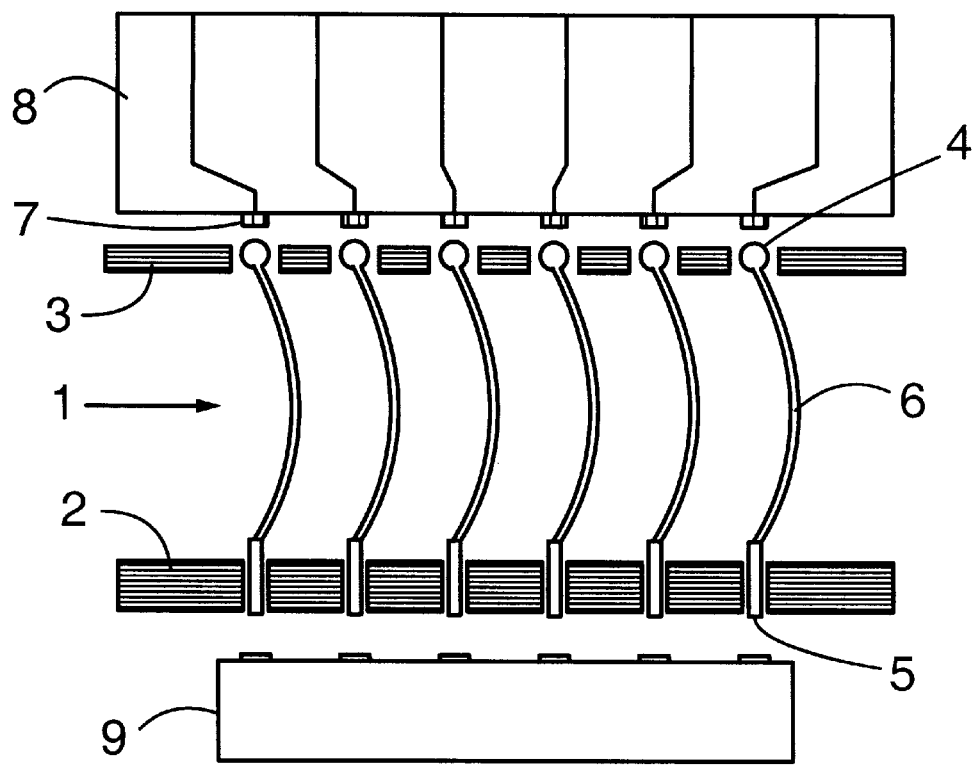
Fig. 1 (Prior Art)
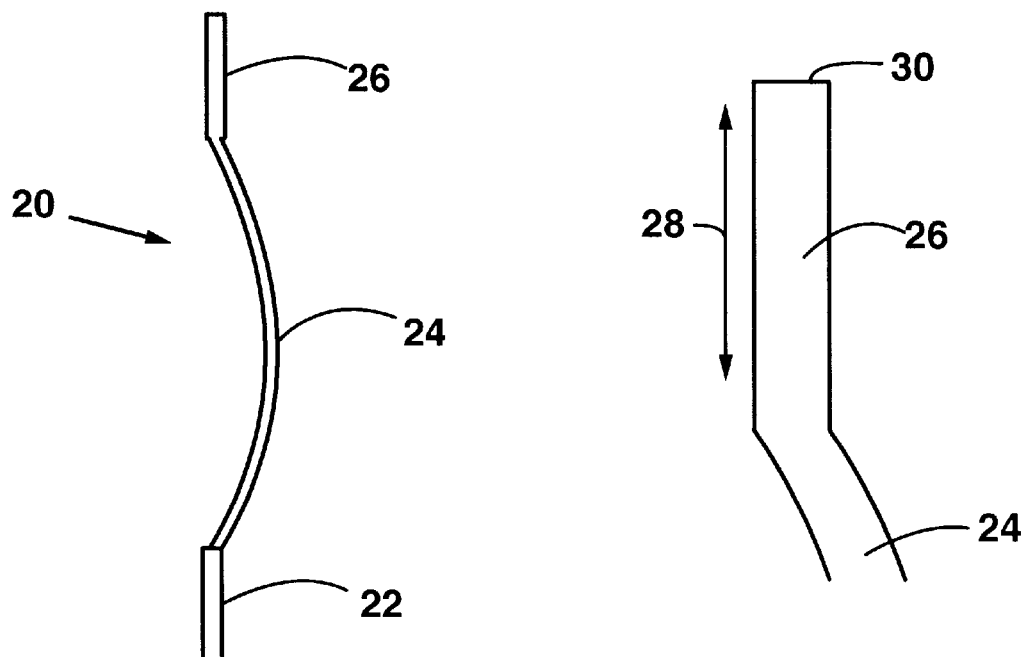
Fig. 2
Fig. 3

METHOD FOR MAKING A PROBE APPARATUS FOR TESTING INTEGRATED CIRCUITS

RELATED APPLICATION

The present application is a divisional application to the parental application No. 09/264,599 filed Mar. 08, 1999, now U.S. Pat. No. 6,419,500 issued Jul. 16, 2002 which is hereby incorporated by reference.

FIELD OF THE INVENTION

This invention relates generally to buckling beam probes for testing integrated circuits. More particularly, it relates to a method for making a probe apparatus equipped with buckling beam probes.

BACKGROUND

Integrated circuit dies are sometimes defective and it is undesirable for economic reasons to package defective dies as packaging often represents an expensive step in the manufacture of integrated circuits. Therefore, integrated circuit (IC) dies should be tested before they are packaged. Very small probes are used to establish electrical contact with the pads of an IC die. The probes are used to apply test voltages at the pads for testing the response of the IC die to determine whether it is defective. IC dies which pass the test are packaged and defective IC dies are discarded.

Buckling beam probe assemblies are often used in the integrated circuit industry to make electrical contact with an integrated circuit die under test. U.S. Pat. No. 4,027,935 to Byrnes et al. describes an exemplary buckling beam probe assembly according to the prior art.

FIG. 1 shows a buckling beam probe assembly according to the prior art. The assembly has buckling beam probes 1 disposed within a lower die 2 and an upper die 3. Each probe 1 has a head 4, a tip 5, and a flexible middle section 6. The heads 4 are positioned by the upper die 3 to contact electrodes 7 of a space transformer 8. The space transformer 8 is in electrical communication with remote testing circuitry. The tips 5 are positioned by the lower die to align with contact pads (not shown) of an integrated circuit (IC) die under test 9. The heads 4 commonly have a rounded surface as shown.

In operation, the IC 9 and tips 5 are brought into contact, and the electrodes 7 and heads 4 are brought into contact. Remote testing circuitry is thus provided with an electrical contact to the IC 9 through the probes 1 and space transformer 8. The flexible middle sections 6 bend so that each probe 1 contacts the IC 9 with approximately the same contact force.

A common problem with buckling beam probe assemblies of this type is that the probes 1 "float" between the lower die 2 and the upper die 3. That is because in this structure the vertical position of the heads 4 and tips 5 is not accurately fixed; rather, the probes 1 shift over a continuous range of positions between the lower die 2 and the upper die 3. Between testing operations, the probes can settle or drop down by as much as 0.003 inches from the position in which the heads 4 touch the electrodes 7. Also, due to slight variations in friction, the tips 5 do not remain in the same horizontal plane. In other words, tip planarity required for establishing good electrical contact between all probes 1 and the corresponding pads of IC 9 is lost.

Many applications of probe assemblies utilize robots with machine vision to align the probe tips 5 with the IC 9. The machine vision apparatus must image the tips 5 to provide accurate alignment. Unfortunately, for proper imaging, the tips 5 must already lie in the same plane. It is difficult and time consuming to properly position the probe assembly if some of the tips 5 are not located within the focal plane of the machine vision apparatus.

Another problem with buckling beam probe assemblies is that, due to the probe "float", the heads 4 impact the electrodes 7 with a substantial velocity. While this velocity may be small, many thousands of impact cycles cause damage to the electrodes 7. This is a problem because space transformers 8 are relatively expensive to replace. Of course, dynamic impacts also damage the heads 4.

To ensure proper electrical contact despite probe float the IC 9 must be contacted with a larger force to thus ensure that all the tips 5 contact the IC 9. Increasing the contact force, in turn increases the forces on the assembly. This situation compounds the above-mentioned problem, since increased contact forces result in high wear rates of electrodes 7 and probes 1. Additionally, high contact forces require that the space transformer 8 be made of strong materials such as ceramics, which tend to be relatively expensive (compared to materials such as polymers).

Presently, a process known as "binning" is used to control the tip planarity and uniformity of the probes 1. Many probes 1 are manufactured and separated into "bins" according to their length. Each probe assembly uses only probes 1 having exactly the same length, i.e., probes from one bin, thereby assuring a certain degree of planarity for the tips 5 and heads 4.

The binning approach presents several problems. First, the binning process is time consuming and relatively expensive. Second, replacing a damaged probe 1 requires a probe from the same bin. Consequently, users of probe assemblies are forced to maintain an inventory of all the probe lengths used. If a suitable replacement probe cannot be found, then all the probes 1 in an assembly must be replaced with probes having identical lengths so that nominal tip planarity is provided.

In view of the above problems, the present state of the art of buckling beam probe assemblies is not satisfactory for low-cost and high-reliability applications. Specifically, the many problems relating to probe tip and probe head planarity are posing a problem in the employment of buckling beam probe assemblies.

OBJECTS AND ADVANTAGES

Accordingly, it is a primary object of the present invention to provide a method for assembling buckling beam probe assemblies that:

1) produces a probe assembly that has exceptional tip and head planarity;
2) produces a probe assembly that has a reduced amount of "float"; and
3) produces a probe assembly that does hot require the application of large contact forces during regular operation.

Further, it is an object of the present invention to provide a probe assembly that:

1) has exceptional head and tip planarity;
2) has a reduced amount of "float";
3) does not require large contact forces for contacting integrated circuits:

These and other objects and advantages will be apparent upon reading the following description and accompanying drawings.

SUMMARY

These objects and advantages are attained by the present method for making a buckling beam probe assembly. The probe assembly has a lower die, and upper die and buckling beam probes. The method calls for inserting the probes into the upper die and lower die so that probe tips extend from the lower die and probe heads extend from the upper die. Then, a planar fiducial surface is pressed against the probe tips, causing them to be aligned in a common plane. Preferably, the planar fiducial surface is planar parallel with the lower die and upper die. Then, while the probe tips are in contact with the planar fiducial surface, the heads are abraded or sanded to a plane parallel with the planar fiducial surface. After sanding, the probes have identical lengths from heads to tips.

Preferably, the planar fiducial surface is pressed against all the tips. The probe tips can be pressed against the planar fiducial surface by simply placing the probe assembly on top of the fiducial surface. Also, spacers can be placed between the lower die and planar fiducial surface.

The abrading step can be performed by placing the planar fiducial surface and probe assembly on top of a Z-stage. The Z-stage is located under a top plate of a table. The Z-stage is raised, raising the probe assembly until the probe heads extend above the top plate. Then, an abrasive plate disposed on the top plate is rubbed against the probe heads. Alternatively, the Z-stage can include the planar fiducial surface. In yet another embodiment, the Z-stage can be replaced with a block of material having a predetermined height. The height of the block is selected so that probe heads extend above the top plate when the probe assembly is placed on the block.

Also included in the present invention is a method for abrading probe tips. The method for abrading probe tips is analogous to the method for abrading probe heads. Probe heads are defined in the present specification as the end of the buckling beam probe intended for contact with a space transformer; probe tips are the end of the buckling beam probe intended for contact with the integrated circuit.

The present invention includes probe assemblies made according to the present invention. Probe assemblies made according to the present invention are characterized by probe heads or probe tips with flat, abraded surfaces.

Description of the Figures

FIG. 1 (Prior Art) shows a buckling beam probe assembly according to the prior art.

FIG. 2 shows a buckling beam probe useful with the present invention.

FIG. 3 shows a close-up view of a probe head of the buckling beam probe of FIG. 2.

DETAILED DESCRIPTION

Figure 4:
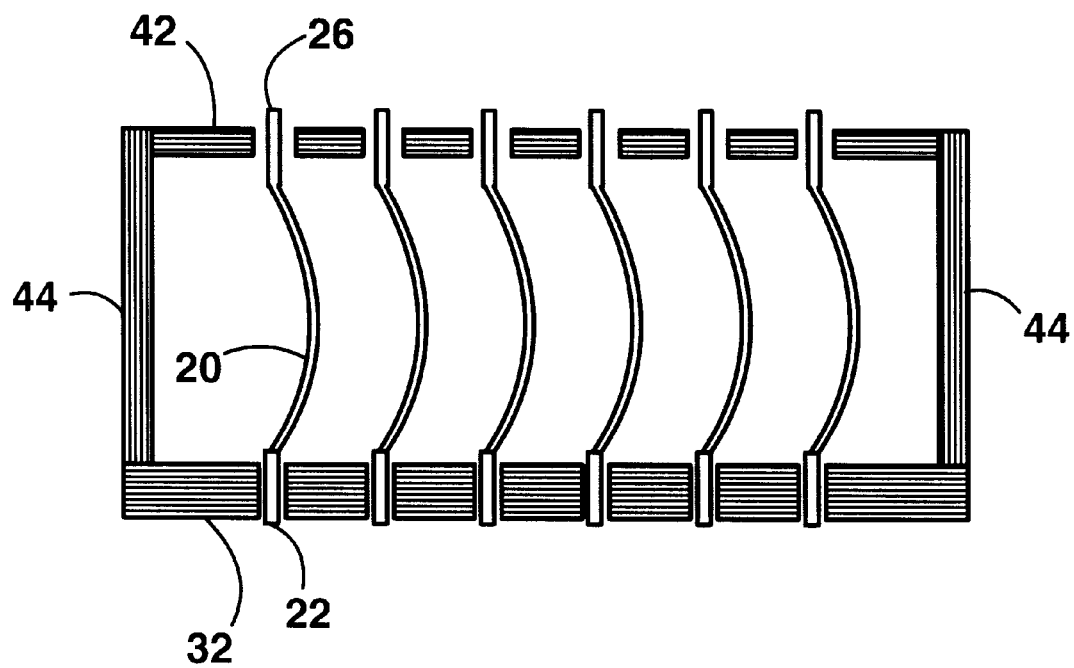
FIGS. 4–6 illustrate a method of the present invention for making buckling beam probe assemblies.

FIG. 2 shows a buckling beam probe 20 for use with the present invention. The probe 20 has a tip 22 for contacting an integrated circuit (IC) die, a flexible middle section 24, and a head 26 for contacting a space transformer or external testing circuitry. The tip 22 can be flat as shown, or it can have a conical, pointed shape.

FIG. 3 shows a close-up view of the head 26. The head has a uniform cross section along its length 28. For example, the head 26 can be a cylinder, or a rectangular prism, or any other 'extruded' shape. A top surface 30 of the head is flat and preferably perpendicular to the length 28 of the head 26. In particular, the top 30 is not spherical or rounded.

FIG. 4 shows a buckling beam probe assembly with which the method of the present invention can be used. The assembly has a lower die 32 and an upper die 42 for holding probes 20. The probes 20 are held by heads 26 and tips 22 in the upper and lower dies. The upper die 42 and lower die 32 are held fixed with respect to one another by a fixture 44. Methods for making buckling beam probe assemblies according to FIG. 4 are well known in the art.

Figure 5:
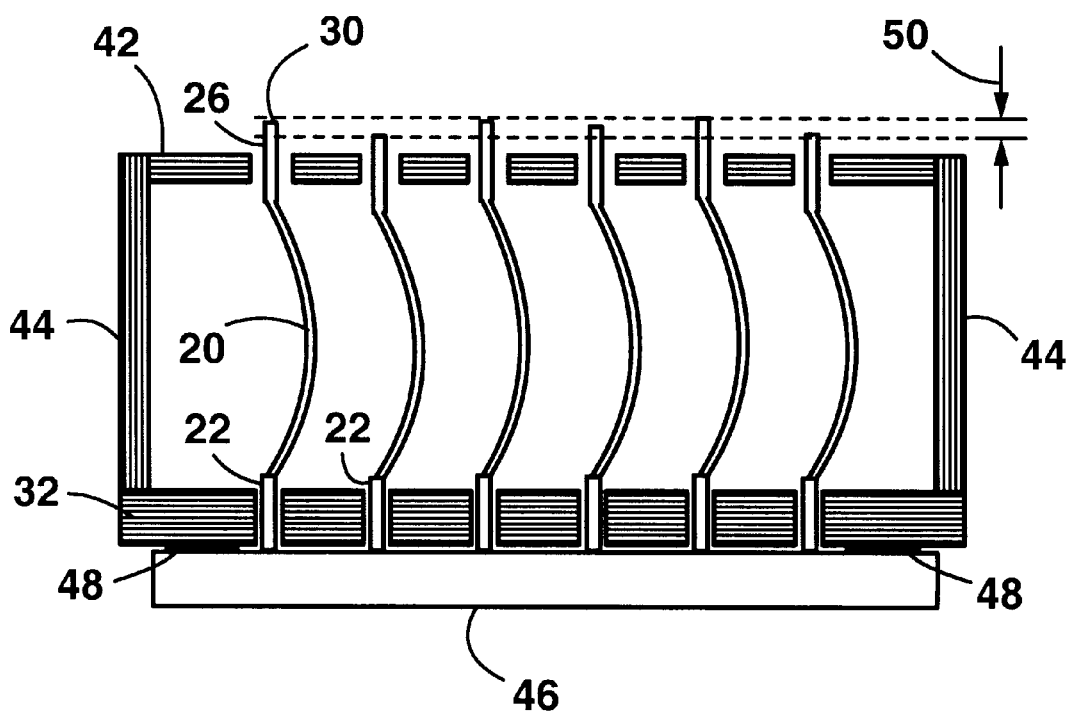

FIG. 5 shows a first step according to method of the present invention. A flat, rigid fiducial plate (e.g. a polished glass plate) 46 is pressed against the probe tips 22, thus causing the probes 20 to move upwards slightly. The fiducial plate 46 contacts all the tips and therefore aligns the tips 22 to a common plane. The plate 46 is held parallel to a high degree of accuracy with the lower die 32. This is be accomplished, for example, by pressing plate 46 against the lower die 32. Optionally, spacers 48 of predetermined known thickness are placed between the lower die 32 and plate 46 to ensure that the plate 46 is parallel with respect to the lower die 32.

Inherently, the probes 20 have slightly different lengths. Therefore, the heads 26 extend beyond the upper die 42 by different amounts when the plate 46 is pressed against the tips 22. Top surfaces 30 of heads 26 generally are located within a range 50.

Figure 6:
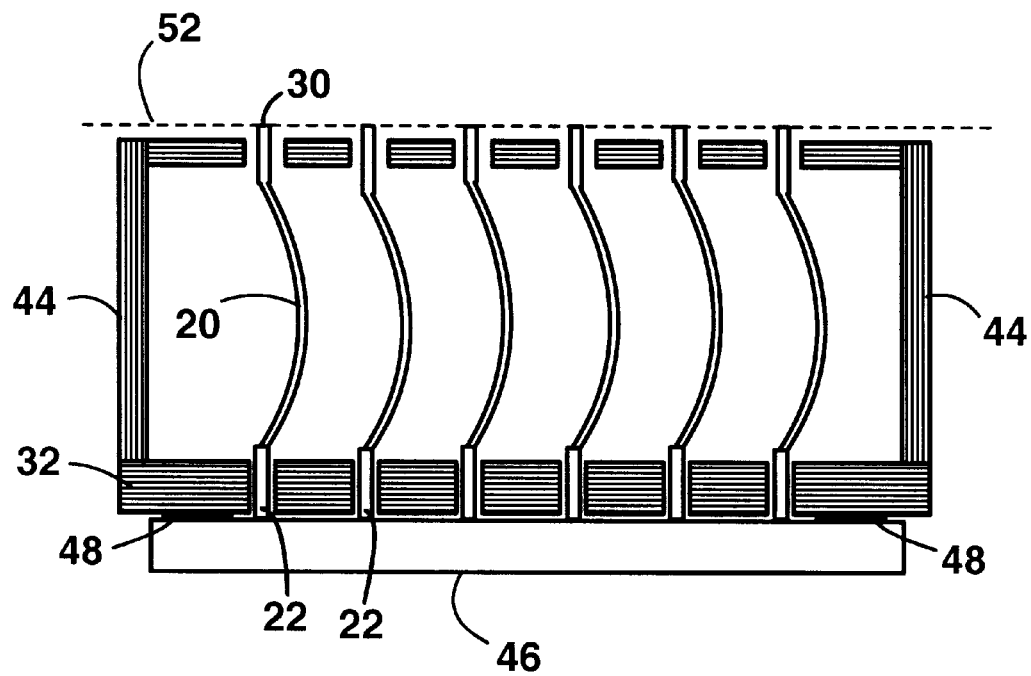

Next, as shown in FIG. 6 heads 26 are sanded down to a plane 52. It is ensured during the sanding process that plane 52 is parallel to a high degree of accuracy with top surface of fiducial plate 46. Plane 52 is located such that every probe 20 in the assembly is sanded. In other words, plane 52 is located below the lower limit of range 50 shown in FIG. 5.

Figure 7:
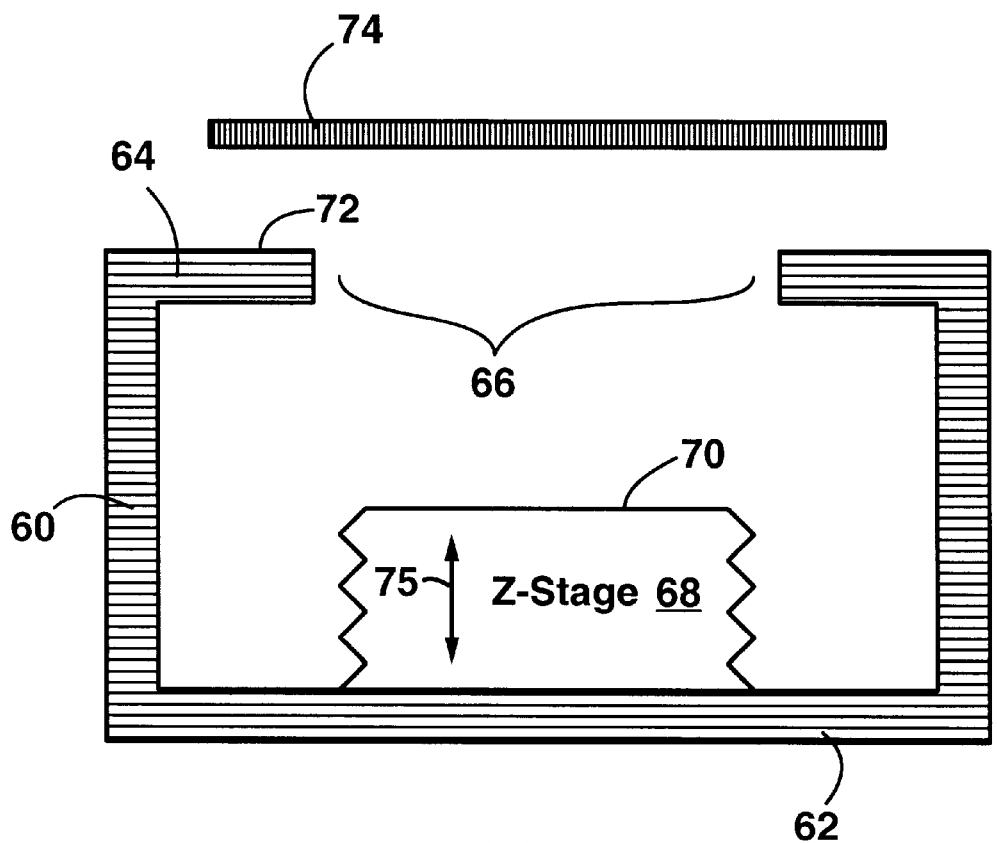
FIG. 7 shows an apparatus for performing the assembly of a preferred embodiment of the present invention.

FIG. 7 illustrates an apparatus for sanding the heads to the plane 52 accurately parallel with fiducial plate 46. The apparatus has a table 60 with a bottom plate 62 and a top plate 64. A Z-stage 68 is disposed on the bottom plate 62. The Z-stage 68 can move up and down in the Z-direction indicated by the arrow in small increments. The top plate 64 has a hole 66 directly above the Z-stage 68. A top surface 70 of the Z-stage 68 is maintained parallel to a high degree of accuracy with a top surface 72 of the top plate 64. A flat, abrasive plate 74 is provided for sliding on the top surface 72 of the top plate 64. The abrasive plate can be in the form of a thin sheet of sandpaper glued to a glass plate, or a sheet of sintered silicon carbide or similar material. Preferably, the roughness of working surface of abrasive plate 74 should be between 3–6 μm.

Figure 8:
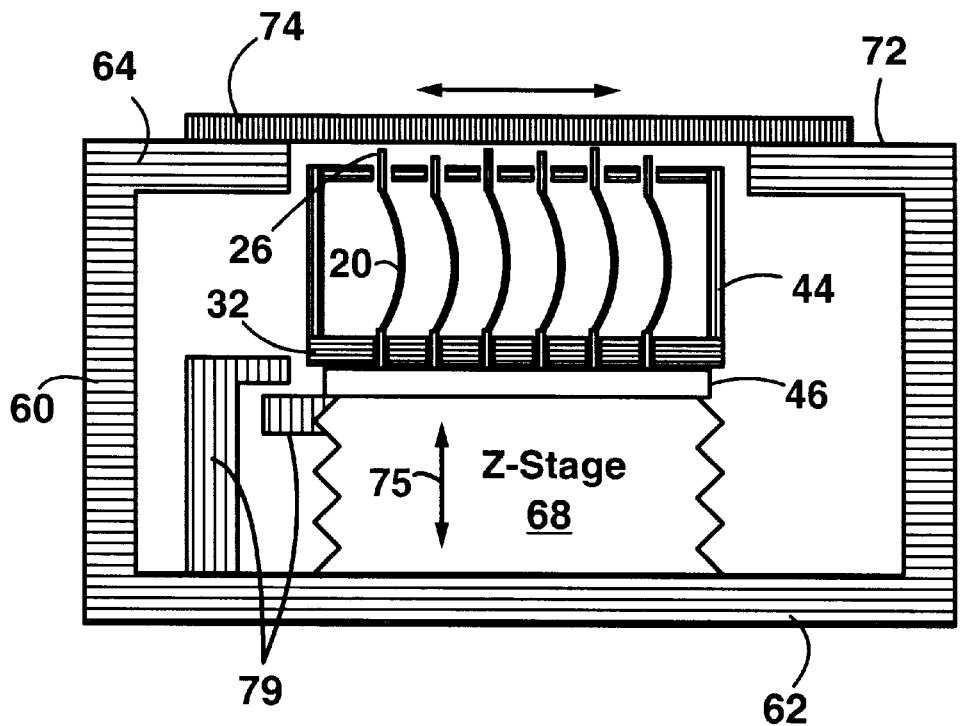
FIGS. 8–9 illustrate preferred embodiments of the present invention.

FIG. 8 shows the apparatus of FIG. 7 in operation sanding heads 26 of a buckling beam probe assembly. The buckling beam probe assembly and fiducial plate 46 are placed onto the Z-stage 68 with the plate 45 contacting the top surface 70. The abrasive plate 74 is placed onto the top surface 72. This ensures that the buckling beam probe assembly is accurately aligned with the abrasive plate 74 (i.e., the abrasive plate 74 is planar parallel with the fiducial plate 46). The abrasive plate 74 is preferably moved in a circular or figure-8 fashion by sliding on the top surface 72. Next, the Z-stage 68 raises the buckling beam assembly until the heads 26 contact the abrasive plate 74. The heads 26 are abraded to a common plane by contact with the moving abrasive plate 74.

Since probes 20 are delicate the rate at which abrasion takes place should be carefully controlled. Preferably, the Z-stage 68 raises the buckling beam probe assembly in small steps or increments and sanding is performed until no more sanding action is detected between the abrasive plate 74 and the heads 26. For example, the Z-stage 68 can be set to raise the buckling beam probe assembly in steps of 0.0001 inches. Alternatively, the Z-stage 68 may raise the buckling beam probe assembly in a very slow, continuous motion while monitoring the sanding action.

After sanding, all the probes 20 have the same length. Of course, each head 26 may have a different length since different amounts of material are sanded from each probe 20. Due to variations in probe length, it is important to use probes which have a relatively long head 26 to accommodate a sufficiently large sanding range. In fact, long head 26 ensures that there is sufficient material available for sanding and that head 26 is not sanded down to the flexible section 24. In practice, the length of heads 26 should be significantly larger than range 50.

Optionally, a fiducial stop mechanism 79 is used to determine a maximum height of the Z-stage 68. This ensures that every buckling beam assembly sanded with the apparatus has probes 20 with the same length from tip 22 to flat top surface 30.

Figure 9:
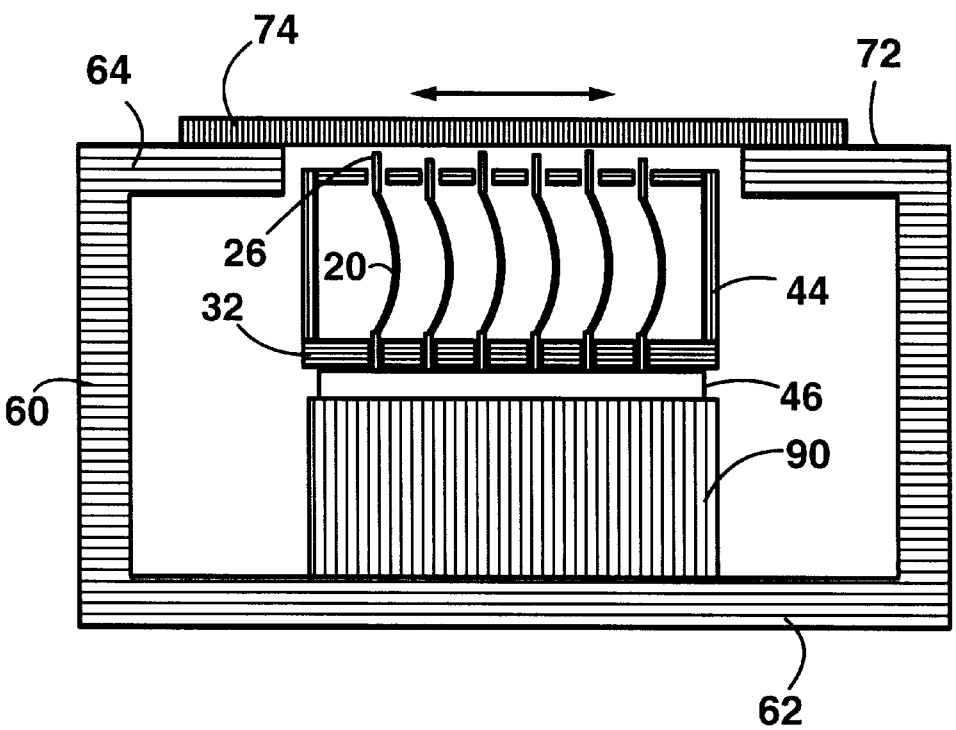

FIG. 9 shows an alternative embodiment of the sanding apparatus. Here, the Z-stage 68 is replaced with a block of material 90 of precise dimensions. A top surface of the block 90 is flat and hard and parallel to a high degree of accuracy with the top surface 72. The probe assembly and fiducial plate 46 are placed on the block 90. Of course, the fiducial plate 46 must have a known thickness. The height of the block 90 is selected so that all the heads 26 extend above the top surface 72. Sanding is performed in the same manner by rubbing the abrasive plate against the heads 26.

Alternatively, the block 90 may replace both the fiducial plate 46 and Z-stage 68. In this case, the probe assembly is placed on the block 90 with the tips 22 contacting the block 90.

Due to the sanding process, the top surface 30 of each head will be rubbed flat. Probes with spherical or rounded heads 26 should not be used with the method of the present invention because the sanding process will planarize the rounded surface. Before sanding, the head 26 can have any shape, but after sanding, the head 26 will always be flat. It is preferable, for the head 26 to have a uniform cross section along its length, as mentioned above. This is because a uniform cross section ensures that after sanding the top surface 30 has a predetermined, known surface area. If the head 26 has a size which varies along its length (e.g., is cone-shaped or spherical), then the surface area of the top surface 30 depends upon how much material is removed during sanding. If the probes have non-uniform cross sectional shapes, then after sanding, the different probes will have top surfaces with different surface areas, which is undesirable.

Figure 10:
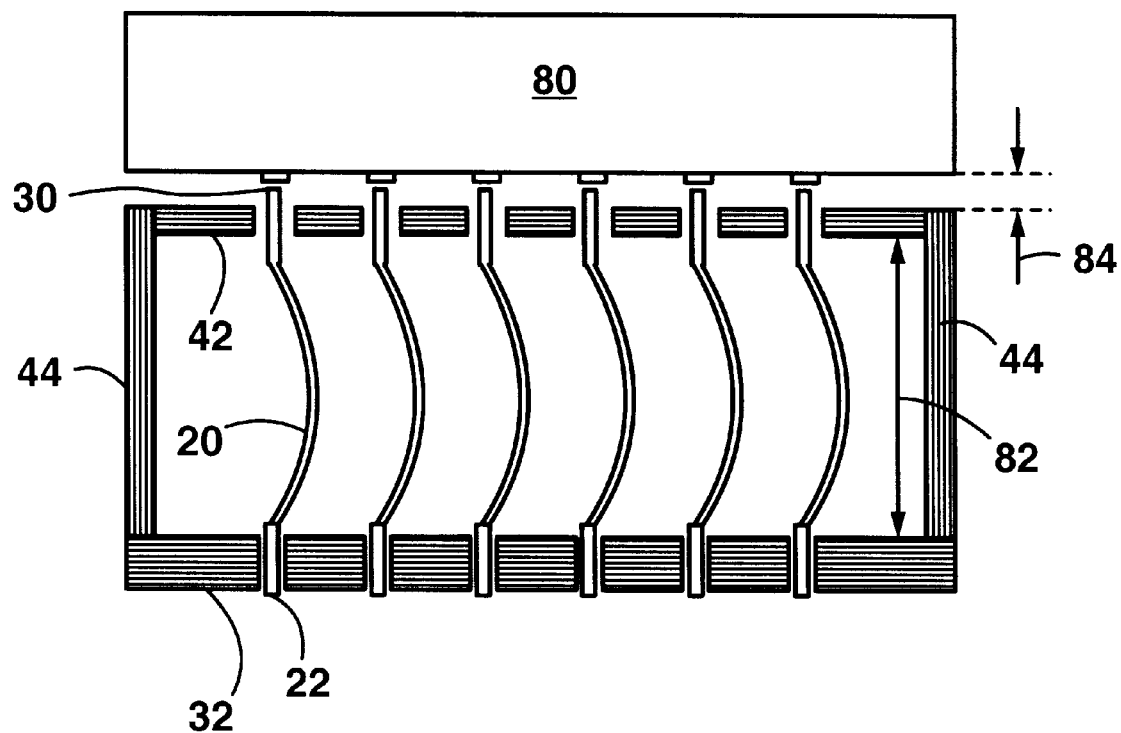
FIG. 10 shows a buckling beam probe assembly made according to the present invention.

FIG. 10 shows a buckling beam probe assembly made according to the present invention in combination with a space transformer 80. As a result of the sanding process, the probes 20 have an accurately determined length from tip 22 to flat top surface 30. This accurately determined length ensures that every probe 20 in the assembly contacts the space transformer 80 with very nearly the same contact force. This allows the space transformer 80 to be located closer to the upper die 42, which reduces the float of the probes 20. Also, this allows smaller contact forces to be used, thereby reducing the mechanical loads on the space transformer 80 and the assembly in general. Reduced mechanical loads allow the designer to use less expensive materials in the construction of the space transformer 80, lower die 32, and upper die 42.

Probe assemblies made according to the present invention can have tighter tolerances on distance 82 between upper die 42 and lower die 32, and on distance 84 between upper die 42 and space transformer 80. These tighter tolerances result in reduced float and more predictable contact forces to ICs and space transformer 80.

The present invention provides probe assemblies having probes with virtually identical lengths. Therefore, when the buckling beam assembly is combined with a space transformer, the distance between the space transformer and upper die can be reduced (compared to prior art probe assemblies). This reduces the float present in the buckling beam probes.

A distinguishing feature of buckling beam probe assemblies of the present invention is that the top flat surfaces 30 of the probes have an abraded or sanded texture. Also, the buckling beam probes 20 generally have a total length from tip 22 to top surface 30 within a range of 0.125 inches. The present method achieves a probe length tolerance of ±0.0001 inches.

Alternatively, the present invention can be used to sand the tips 22 instead of the heads 26. In this embodiment, the heads 26 are contacted to the fiducial plate 46, and the abrasive plate is rubbed against the tips 22. Generally, the process of abrading the tips 22 is exactly the same as that of abrading the heads 26 except that the probe assembly is located upside down in the apparatus of FIG. 7.

Also, in the present invention, both the heads 26 and tips 22 can be abraded. This is accomplished in two separate steps of abrading one side of the probe apparatus and then the other side. The advantage in abrading both sides of the probes 20 is that after the first sanding, e.g,. of the heads 26, the probes 20 have time to relax and shift naturally, as they would during regular operation or cycling before sanding of the tips 22. Thus, the probes 20 are sanded at their minimally disturbed position.

It will be clear to one skilled in the art that the above embodiment may be altered in many ways without departing from the scope of the invention. Accordingly, the scope of the invention should be determined by the following claims and their legal equivalents.

What is claimed is:

1. A method for making a buckling beam probe assembly having an upper die, a lower die, and buckling beam probes having probe heads and probe tips, the method comprising the steps of:

a. disposing the buckling beam probes in the lower die and the upper die such that the probe tips protrude form the lower die and such that the probe heads protrude from the upper die;

b. placing the assembly on a Z-stage located under a top plate of a table, wherein the Z-stage has a planar fiducial surface and wherein the probe tips are in immediate proximity to the planar fiducial surface of the Z-stage;

c. pressing the planar fiducial surface against the probe tips such that the probe tips are coplanar with the planar fiducial surface;

d. placing an abrasive plate on top of the top plate of the table;

e. raising the assembly with the Z-stage until the probe heads contact the abrasive plate; and f. abrading the probe heads to a plane parallel with the planar fiducial surface by rubbing the abrasive plate against the probe heads.

2. A method for making a buckling beam probe assembly having an upper die, a lower die, and buckling beam probes having probe heads and probe tips, the method comprising the steps of:

a. disposing the buckling beam probes in the lower die and the upper die such that the probe tips protrude form the lower die and such that the probe heads protrude from the upper die;

b. placing the assembly on a block located under a top plate of a table such that the probe tips are pressed against a planar fiducial surface of the block and such that the probe tips are coplanar with the planar fiducial surface, wherein the block has a height selected such that the probe heads of the assembly extend above the top plate;

c. placing an abrasive plate on top of the top plate of the table; and d. abrading the probe heads to a plane parallel with the planar fiducial surface by rubbing the abrasive plate against the probe heads.

3. A method for making a buckling beam probe assembly having an upper die, a lower die, and buckling beam probes having probe heads and probe tips, the method comprising the steps of:

a. disposing the buckling beam probes in the lower die and the upper die such that the probe tips protrude form the lower die and such that the probe heads protrude from the upper die;

b. pressing a planar fiducial surface against the probe tips such that the probe tips are coplanar with the planar fiducial surface;

c. abrading the probe heads to a plane parallel with the planar fiducial surface by:

i. placing the assembly and planar fiducial surface on a block located under a top plate of a table, wherein the block has a height selected such that the probe heads of the assembly extend above the top plate;

ii. placing an abrasive plate on top of the top plate of the table; and iii. rubbing the abrasive plate against the probe heads.

4. A method for making a buckling beam probe assembly having an upper die, a lower die, and buckling beam probes having probe heads and probe tips, the method comprising the steps of:

a. disposing the buckling beam probes in the lower die and the upper die such that the probe tips protrude form the lower die and such that the probe heads protrude from the upper die;

b. placing the assembly on a Z-stage located under a top plate of a table, wherein the Z-stage has a planar fiducial surface and wherein the probe heads are in immediate proximity to the planar fiducial surface of the Z-stage;

c. pressing the planar fiducial surface against the probe heads such that the probe heads are coplanar with the planar fiducial surface;

d. placing an abrasive plate on top of the top plate of the table;

e. raising the assembly with the Z-stage until the probe tips contact the abrasive plate; and f. abrading the probe tips to a plane parallel with the planar fiducial surface by rubbing the abrasive plate against the probe tips.

5. A method for making a buckling beam probe assembly having an upper die, a lower die, and buckling beam probes having probe heads and probe tips, the method comprising the steps of:

a. disposing the buckling beam probes in the lower die and the upper die such that the probe tips protrude form the lower die and such that the probe heads protrude from the upper die;

b. placing the assembly on a block located under a top plate of a table such that the probe heads are pressed against a planar fiducial surface of the block and such that the probe heads are coplanar with the planar fiducial surface, wherein the block has a height selected such that the probe tips of the assembly extend above the top plate;

c. placing an abrasive plate on top of the top plate of the table; and d. abrading the probe heads to a plane parallel with the planar fiducial surface by rubbing the abrasive plate against the probe heads.

6. A method for making a buckling beam probe assembly having an upper die, a lower die, and buckling beam probes having probe heads and probe tips, the method comprising the steps of:

a. disposing the buckling beam probes in the lower die and the upper die such that the probe tips protrude form the lower die and such that the probe heads protrude from the upper die;

b. pressing a planar fiducial surface against the probe heads such that the probe heads are coplanar with the planar fiducial surface;

c. abrading the probe tips to a plane parallel with the planar fiducial surface by:

i. placing the assembly and planar fiducial surface on a block located under a top plate of a table, wherein the block has a height selected such that the probe tips of the assembly extend above the top plate;

ii. placing an abrasive plate on top of the top plate of the table; and iii. rubbing the abrasive plate against the probe tips.

* * * * *